United States Patent
Brindle et al.

(10) Patent No.: US 7,529,526 B2
(45) Date of Patent: May 5, 2009

(54) APPARATUS AND METHOD FOR DETECTING RADIO FREQUENCY TRANSMISSION POWER LEVELS

(76) Inventors: Christopher Brindle, 48 Homefield Ave., Dracut, MA (US) 01826; Norbert Andrew Schmitz, 42 Green Haven Rd., Salem, NH (US) 03079-1350; Christopher Dirk Weigand, 2 Laconia Dr., Andover, MA (US) 01810

( * ) Notice: Subject to any disclaimer, the term of this patent is extended or adjusted under 35 U.S.C. 154(b) by 251 days.

(21) Appl. No.: 10/868,123

(22) Filed: Jun. 15, 2004
(Under 37 CFR 1.47)

(65) Prior Publication Data

US 2005/0227643 A1    Oct. 13, 2005

Related U.S. Application Data

(63) Continuation-in-part of application No. 10/820,564, filed on Apr. 8, 2004, now abandoned.

(51) Int. Cl.
*H04B 1/04* (2006.01)

(52) U.S. Cl. .................. 455/127.1; 455/126; 455/115.1

(58) Field of Classification Search .................. 455/78, 455/82, 83, 127.1, 127.2, 126, 115.1
See application file for complete search history.

(56) References Cited

U.S. PATENT DOCUMENTS 6,236,840 B1 * 5/2001 Aihara et al. .................. 455/83
6,308,047 B1 * 10/2001 Yamamoto et al. ............ 455/73
2002/0032009 A1 * 3/2002 Otaka et al. .................... 455/83
2005/0118962 A1 * 6/2005 Sheiman ....................... 455/78

FOREIGN PATENT DOCUMENTS

EP    0 632 289 A2    1/1995

OTHER PUBLICATIONS

Patent Abstracts of Japan, Publication No. 2000068867; Publication Date: Mar. 3, 2000; Inventor: Nakamura Hiroshi; Title: Radio Telephone System And Radio Telephone Equipment.
Patent Abstracts of Japan, Publication No. 58047332; Publication Date: Mar. 19, 1983; Inventor: Otsuka Shoichi; Title: Control Circuit Of Transmission Output.
Patent Abstracts of Japan, Publication No. 09321653; Publication Date: Dec. 12, 1997; Inventor: Akitani Makoto; Title: Transmission Reception Changeover Circuit With Transmission Output Monitor.

* cited by examiner

*Primary Examiner*—Blane J Jackson (57) ABSTRACT

An apparatus and method for detecting radio frequency transmit power levels produced by a power amplifier of a wireless device is described. In one exemplary apparatus implementation, the apparatus includes a power amplifier, an antenna switch and a power amplifier detector. The power amplifier is configured to amplify a transmit signal at a desired power level. An antenna switch, is located between the power amplifier and an antenna, and is configured to switch the antenna from a receive mode to a transmit mode and vice versa. A power amplifier detector is connected to the antenna switch. The power amplifier detector is configured to receive a leakage signal from the antenna switch as a basis to detect the power level of the transmit signal.

20 Claims, 6 Drawing Sheets

APPARATUS AND METHOD FOR DETECTING RADIO FREQUENCY TRANSMISSION POWER LEVELS

CROSS-REFERENCE TO RELATED APPLICATIONS

The present patent application is a continuation-in-part of U.S. patent application Ser. No. 10/820,564, entitled "Apparatus and Method For Detecting Radio Frequency Transmission Power Levels," by Andrew Schmitz, having a filing date of Apr. 8, 2004, and is commonly assigned herewith. The contents of the aforementioned application are fully incorporated by reference herein.

TECHNICAL FIELD

The present invention relates generally to wireless devices, and more particularly, to detecting power levels associated with radio frequency signals produced by power amplifiers in wireless devices.

BACKGROUND

Most standards used to regulate communications from wireless devices to base stations require that each wireless device control how much power is emitted from the wireless device when transmitting a radio frequency signal to the base station. As used herein a wireless device refers generally to portable and mobile wireless devices that use radio frequency signals to transmit and receive information. For instance, wireless devices refers to, but is not necessarily limited to, cellular telephones, personal communication systems phones, radiotelephone handsets, personal digital assistants, and other current and future wireless handsets.

These communication standards are instituted to ensure that when different wireless devices transmit signals to a particular base station, the base station receives the signals at relatively the same power level. Otherwise, if some wireless devices emit signals with higher power levels than other wireless devices to the same base station, the signals with the higher power levels can swamp (i.e., inundate, overtake, or overpower) signals with lower power levels.

Accordingly, power levels for signals emitted by a wireless device are dynamically controlled over various power level ranges dependent upon various factors, such as how far away the wireless device is from the base station. For example, the closer a wireless device is to a base station, the less power the transmit signals need in order to maintain a consistent received-signal power level when the signals are received at the base station. On the other hand, the farther away a wireless device is from a base station, the more power the transmit signals need in order to maintain a consistent received-signal power level at the base station.

The key components used to control the power level of signals emitted by wireless devices are a radio frequency (RF) power amplifier and a control circuit used to set the power level of the power amplifier. The power amplifier is primarily used to amplify power levels of signals generated by a transmit module of the wireless device before the signals are transmitted by an antenna. The control circuitry typically adjusts the power levels produced by the RF power amplifier through a feedback loop.

The feedback loop typically includes an RF directional coupler and a detector diode connected to an output terminal of the power amplifier for the purpose of transferring a voltage measurement indicative of the power level produced by the power amplifier back to the control circuitry. The power level feedback enables the control circuitry to directly monitor and adjust the power level produced by the power amplifier, i.e., boost, maintain, or reduce the power level produced by the power amplifier.

In some implementations, it is possible to measure the current produced at the output of the power amplifier as means for monitoring the power level produced by the power amplifier. This may be accomplished through the use of a current sensing resistor coupled to the output of the power amplifier.

In either of the implementations, power losses are attributable to the directional coupler/detector diode or the sensing resistor. These power losses reduce the battery life of a wireless device, which in turn reduces the usage time (standby and communication time (e.g., talk time)) for a user of the wireless device. Additionally, these circuitry components (i.e., directional coupler/detector diode or sensing resistor) add to the overall cost to manufacture a wireless device. Furthermore, most wireless device manufactures strive to reduce the size and weight of the wireless devices; however, these circuitry components increase the overall size of a wireless device, because they increase the parts count associated with the wireless device.

SUMMARY

An apparatus and method for detecting radio frequency transmission power levels produced by a power amplifier of a wireless device is described. In one exemplary implementation, the apparatus is a transmit module of a wireless device and includes a power amplifier, an antenna switch and a power amplifier detector. The power amplifier is configured to amplify a transmit signal to a desired power level. The antenna switch is located between the power amplifier and the antenna, and is configured to switch the transmit module between a receive mode and a transmit mode. The power amplifier detector is connected to the antenna switch. The power amplifier detector is configured to receive a leakage signal from the antenna switch as a basis to measure the power level of the transmit signal.

In one implementation, the leakage signal is detected directly from the antenna switch, when the antenna switch is the transmit mode. In an alternative implementation, the leakage signal is detected indirectly from the antenna switch, by measuring the leakage signal from a control line located between a driver for the antenna switch and the antenna switch. In either implementation, the leakage signal is indicative of the power level of the transmit signal.

The described implementations, therefore, introduce the broad concept of detecting the power level of a power amplifier by measuring a leakage signal through an antenna switch during a transmit mode for a wireless device. By measuring the leakage signal, the power efficiency of the wireless device is substantially increased, because no additional losses are incurred as a result of using passive components, such as directional couplers, inserted between the output port of a power amplifier and an antenna switch, as described above in the Background section. Additionally, the part count for wireless devices is reduced, which in turn reduces the overall size and weight of the wireless device, by shrinking the amount of area needed for a transmit module. There is also an overall cost reduction associated with manufacturing wireless devices, because several of the discrete components, such as directional couplers and diodes, may be eliminated from the design of the wireless devices.

BRIEF DESCRIPTION OF THE DRAWINGS

The detailed description is described with reference to the accompanying figures. In the figures, the left-most digit(s) of a reference number identifies the figure in which the reference number first appears.

DETAILED DESCRIPTION

Figure 1:
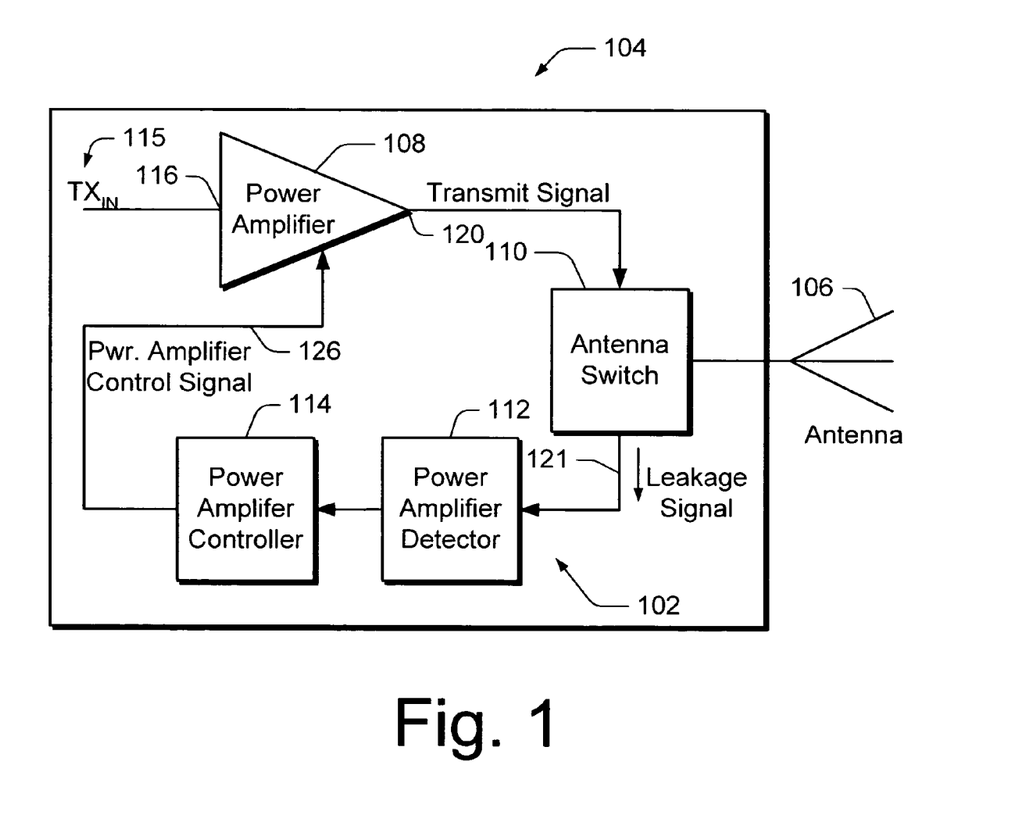
FIG. 1 illustrates select components of an exemplary wireless device that can be utilized to implement the inventive techniques described herein.

FIG. 1 illustrates select components of an exemplary wireless device that can be utilized to implement the inventive techniques described herein. In particular, FIG. 1 shows a transmit/receive (T/R) module 104 of a wireless device (the illustrated T/R module includes components helpful in describing the present invention as disclosed herein and may include additional components). The T/R module 104 includes a power amplifier control loop 102 that may be used to control the power level of a transmit signal output from a power amplifier 108 by measuring a leakage signal output from an antenna switch 110.

The power amplifier control loop 102 is ultimately configured to control the power level of a signal propagated by the antenna 106. In other words, the power amplifier control loop 102 is configured to control a power level, (i.e., watts, milliwatts, dBm (decibels below 1 milliwatt), decibels, and other output power level expressions) associated with radio frequency signals emitted by the wireless device via the antenna 106.

In one implementation, the power amplifier control loop 102 includes a power amplifier 108, an antenna switch 110, a power amplifier detector 112, and a power amplifier controller 114.

The power amplifier 108 is a radio frequency power amplifier configured to amplify a radio frequency signal (also referred to as a transmit-in ($TX_{IN}$) signal). The power amplifier 108 receives radio frequency signal $TX_{IN}$ at an input terminal 116 and produces an amplified transmit signal at an output terminal 120. Although only one power amplifier is shown, it is appreciated that the power amplifier 108 may represent multiple amplifier stages. Additionally, it is also appreciated that more than one input and/or output terminal may be present on certain power amplifier designs, although not illustrated in FIG. 1.

The antenna switch 110 receives amplified transmit signal via the output terminal 120 and connects the transmit signal to the antenna 106, where the transmit signal is transmitted to a base station (not shown). Typically, when the T/R module 104 is in a transmit mode, the antenna switch 110 ensures that the output terminal 120 is connected to the antenna 106. When the T/R module 104 is in a receive mode, the antenna switch 110 disconnects the output terminal 120 from the antenna 106, and connects the antenna 106 to a receive path (not shown) in the wireless device.

A small amount of the transmit signal (also referred to as a "portion of transmit signal") leaks from the antenna switch 110 in the form of a leakage signal, when the antenna switch 110 is in the transmit mode. The leakage signal is transmitted to the power amplifier detector 112, either directly or indirectly via a connection 121 (e.g., a wire, link, bus, or combination of various circuit elements). In one implementation, the leakage signal is in the order of −35 decibels-relative-to-carrier (dBc). As shall be described with reference to FIGS. 2, 3, 4A, and 4B, there are various points where a leakage signal is measured to determine and affect the power level of the transmit signal from the output terminal 120.

The power amplifier detector 112 is configured to measure the leakage signal to determine the power level of the leakage signal. The measured power level of the leakage signal is indicative of a power level of the transmit signal. In one implementation, a power level of 30 dBm for the transmit signal correlates to approximately −5 dBm for the leakage signal. Of course, various other correlations may be extrapolated through measurement tests. It is also appreciated that the correlation between power levels for the transmit signal and leakage signal may vary dependent upon antenna switch designs, components manufacturers, environmental influences, and other design variations.

The power amplifier detector 112 converts the leakage signal to an analog control signal at the output of the power amplifier detector 112. This analog control signal is then used by the power amplifier controller 114 to adjust the power of the power amplifier 108. In one exemplary implementation, the power amplifier controller 114 transmits the power amplifier control signal via a connection 126 (e.g., a wire, link, bus, or combination of various circuit elements) to adjust the gain of the power amplifier 108.

Figure 2:
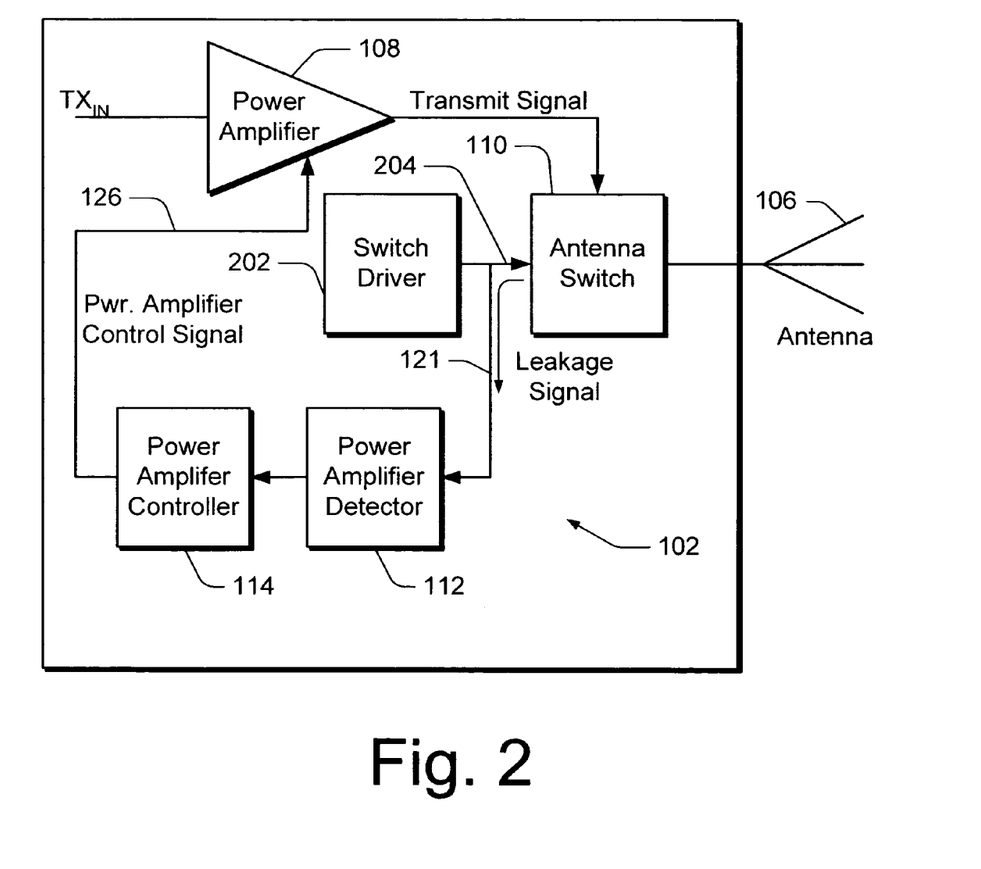
FIG. 2 shows a power amplifier control loop that may be used to control the power level of a transmit signal from a power amplifier by measuring a leakage signal from a control line used to control the antenna switch.

FIG. 2 shows an exemplary implementation for connecting the power amplifier detector 112 to the antenna switch 110. FIG. 2 is identical to FIG. 1, except it shows the additional detail of a switch driver 202 connected to the antenna switch 110 via a decoder control line 204. The switch driver 202 controls the switching mode (or state) of the antenna switch 110. The switch driver 202 generates direct current (DC) binary signals, which are transferred to the antenna switch 110 via the decoder control line 204. These DC binary signals control how and when the antenna switch 110 switches between the transmit and receive modes.

In the exemplary implementation, the power amplifier detector 112 is connected to the decoder control line 204 via connection 121. Accordingly, the leakage signal is measured from the decoder control line 204, when a portion of the transmit signal leaks back onto the decoder control line 204 and is transferred to the power amplifier detector 112 via the connection 121. Again, the leakage signal flows from the antenna switch 110 to the power amplifier detector 112 when the antenna switch 110 is in the transmit mode.

Figure 3:
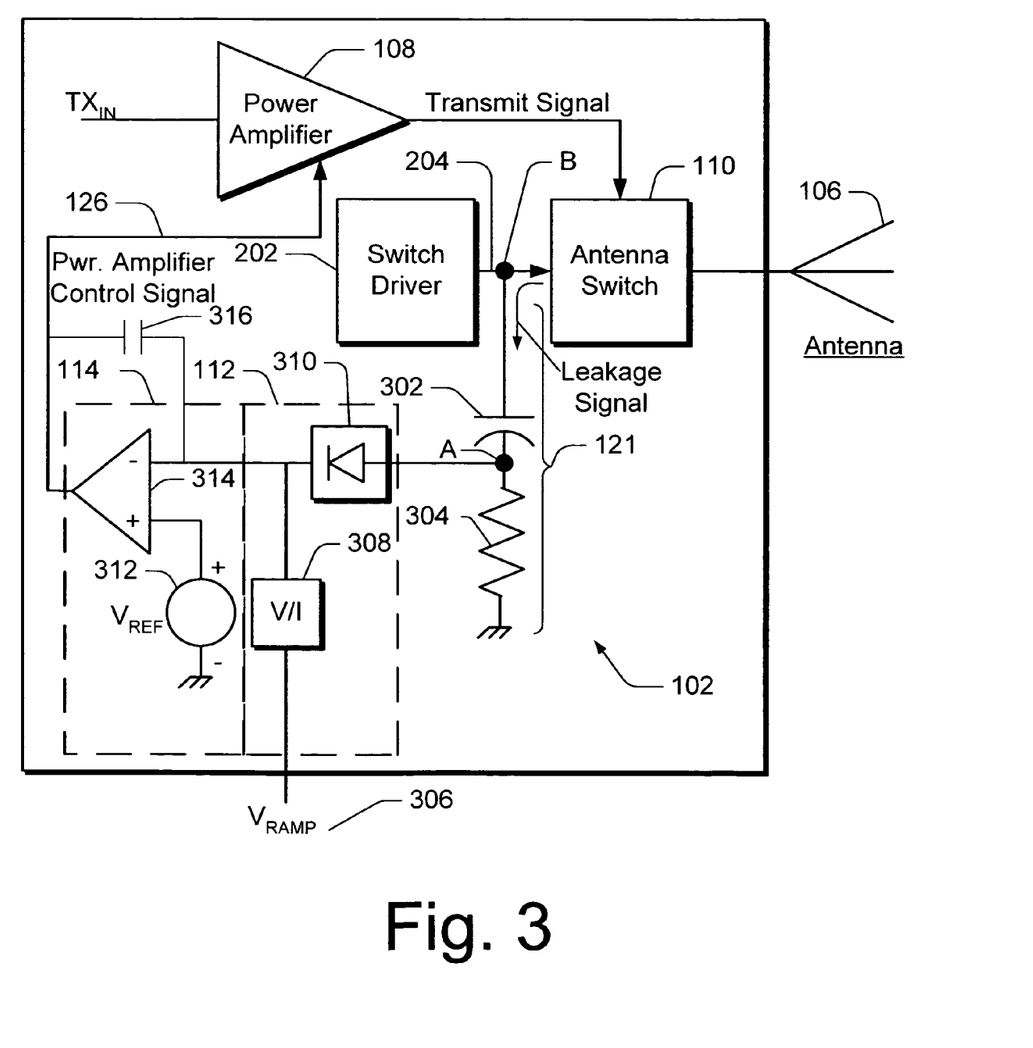
FIG. 3 shows one example of a lower level circuit diagram for implementing the control loop illustrated in FIG. 2.

FIG. 3 shows additional details of how the power amplifier detector 112 can be connected to the control line 204. In this exemplary illustration, the connection 121 includes a capacitor 302, which is connected to the control line 204. The capacitor 302 is also connected in series with a resistor 304, which is grounded. The power amplifier detector 112 is connected to a node A, located between the capacitor 302 and the resistor 304.

In operation, when the antenna switch 110 is in the transmit mode, the leakage signal (i.e., RF leakage signal) passes through the capacitor 302. A voltage level (i.e., RF voltage level) associated with the leakage signal is realized at node A, which is detected by the power amplifier detector 112. It is noted that the DC binary signal produced by the switch driver 202 and transmitted on the control line 204 is blocked by the capacitor 302. However, since the leakage signal is an RF signal, the RF voltage associated with the signal is realized across the resistor 304, which can be detected at node A.

FIG. 3 also shows lower-level details of the power amplifier detector 112 and the power amplifier controller 114. For instance, the power amplifier detector 112 contains a detector 310, which is typically a detector diode. A voltage-to-current (V/I) converter 308 converts the $V_{RAMP}$ voltage to a sinking current, whereas the detector 310 provides a source current. Both the sinking current and source current are used to drive a power control amplifier 314, which is used as an integrator. When the sum of the sinking current and the source current is equal, the voltage on a feedback capacitor 316 at the output of the power control amplifier 314 becomes fixed. At this point, the power amplifier control loop 102 is in equilibrium, with a fixed power out of the power amplifier 108, which is dependent on the control voltage $V_{RAMP}$ 306.

In an alternative implementation, two detector diodes (not shown) can be used in place of a single detector diode. For instance, with two detector diodes (not shown), one detector diode does the detecting, and the other detector diode is biased with the same current, so that the control loops sensitivity to temperature is minimized. The latter diode is used to obtain the reference voltage $V_{REF}$ 312.

Figure 4A:
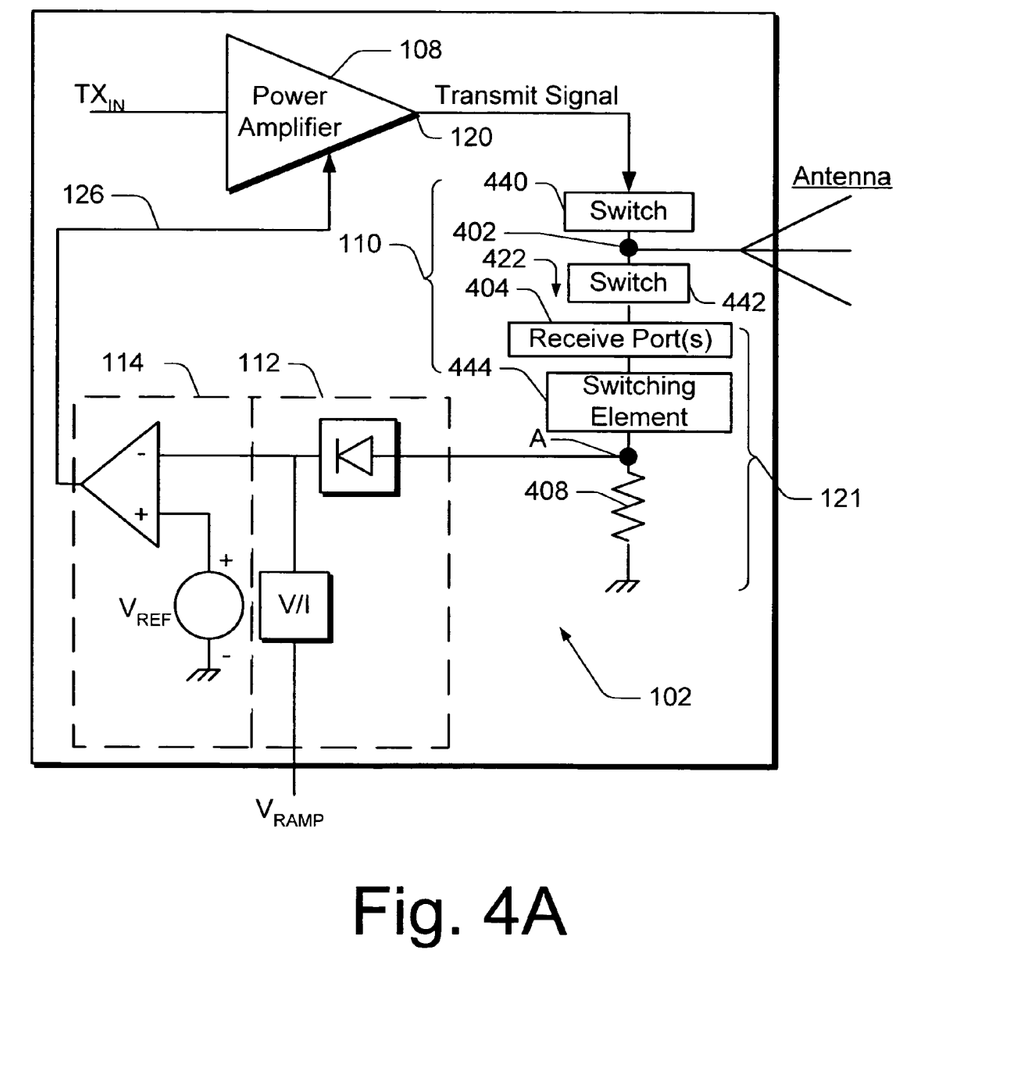
FIG. 4A shows a power amplifier control loop that may be used to control the power level of a transmit signal from a power amplifier by measuring a leakage signal at a ground port of the antenna switch.

FIG. 4A shows an alternative implementation for connecting the power amplifier detector 112 to the antenna switch 110. In this implementation, the output terminal 120 of the power amplifier 108 is connected to an antenna port 402 of the antenna switch 110 via a switch 440. A switching element 444 is connected to a receive port 404 of the antenna switch 110. A resistor 408 is connected to the switching element 444.

In one implementation, the antenna switch 110 includes four receive ports (not shown), and two antenna ports, but other quantities of receive and antenna ports, greater or smaller, may be used in other implementations. In one implementation, the switches 440 and 442 are Field Effect Transistors (FETs). Alternatively, the switches can include other types of switching elements, such as a diode, a pin-diode, a transistor, and/or one or more other types of switching elements.

In operation, when the antenna switch 110 is in the transmit mode, some of the transmission power associated with the transmit signal leaks onto one or more of the receive ports 404. In the transmit mode the switching element 444 connects the one or more receive ports 404 to the resistor 408. A power level associated with the leakage signal is realized at node A, which is detected by the detector 112. Once again, the detector 112 in conjunction with the power amplifier controller 114, adjust the output power level of the power amplifier 108 based on the power level of the leakage signal and the external $V_{RAMP}$ signal. In one implementation, the leakage signal will generally range between −20 to −40 dBc relative to the power amplifier output 120.

Figure 4B:
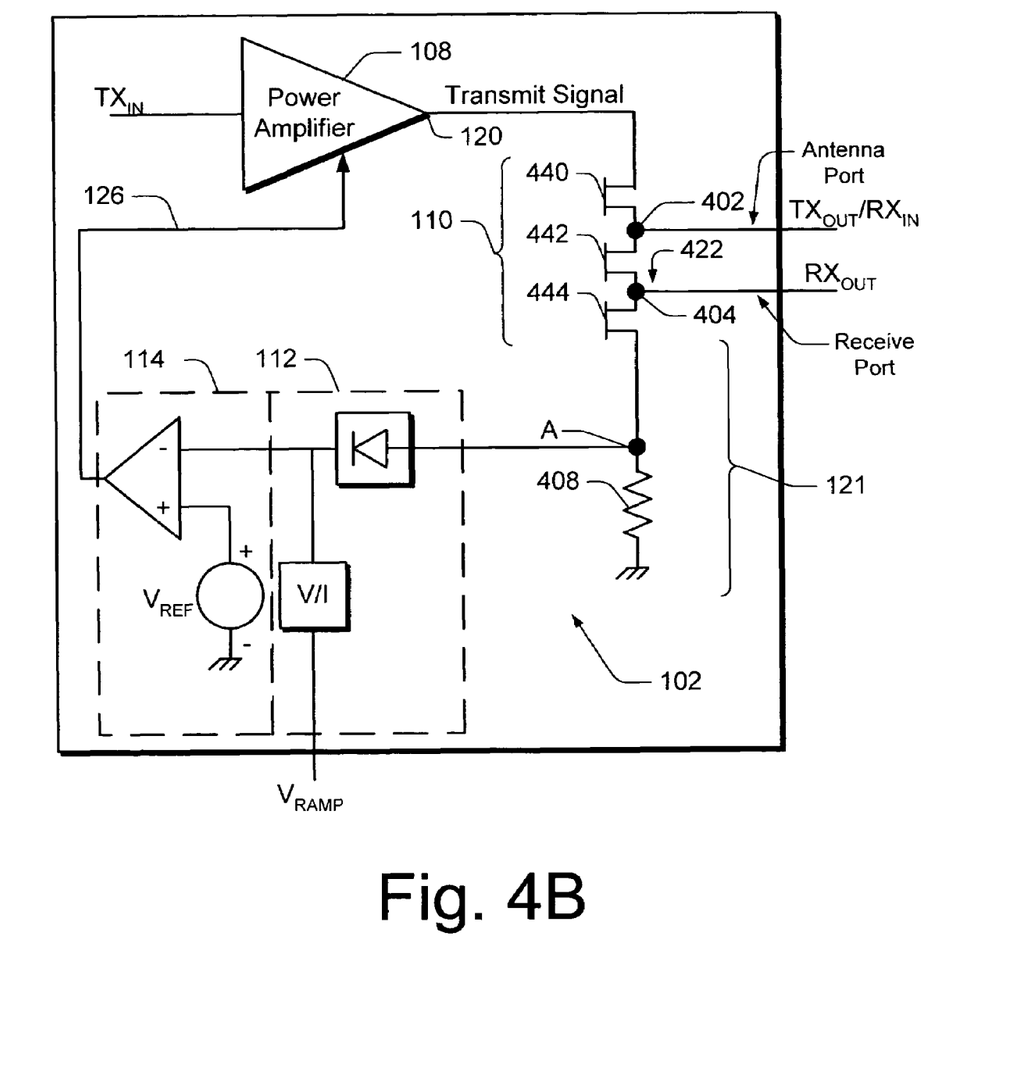
FIG. 4B illustrates select circuitry for connecting the power amplifier detector to the antenna switch according to one exemplary embodiment.

FIG. 4B illustrates select circuitry for connecting the power amplifier detector 112 to the antenna switch 110 according to one exemplary embodiment. As shown in this illustration, the switch 440 connects the power amplifier 108 to the antenna port 402. The switch 442 connects the antenna port 402 to the receive port 404. The switching element 444 connects the receive port 404 to node A.

In operation, when in the transmit mode, the power amplifier 108 transmits the transmit signal to switch 440, which is CLOSED allowing power to be transmitted out of antenna port 402 to the antenna. Switch 442 is OPEN, but a leakage signal (shown as 422) passes through switch 442 to switching element 444. Switching element 444 is CLOSED allowing a leakage signal to be transmitted to node A. A voltage is then generated across resistor 408, which is detected by power amplifier detector 112.

When in the receive mode, detection is not performed, and the switches 440 and 442, and switching element 444 are in an inverse state from the transmit mode. For instance, when in the receive mode, switch 440 is OPEN, switch 442 is CLOSED, and switching element 444 is OPEN. As shown in FIG. 4B, the switches 440 and 442 are implemented with series FETs, and switching element 444 is implemented with a shunt FET, but other types of switches could be employed, such as diodes, transistors, and other related switching elements.

Figure 5:
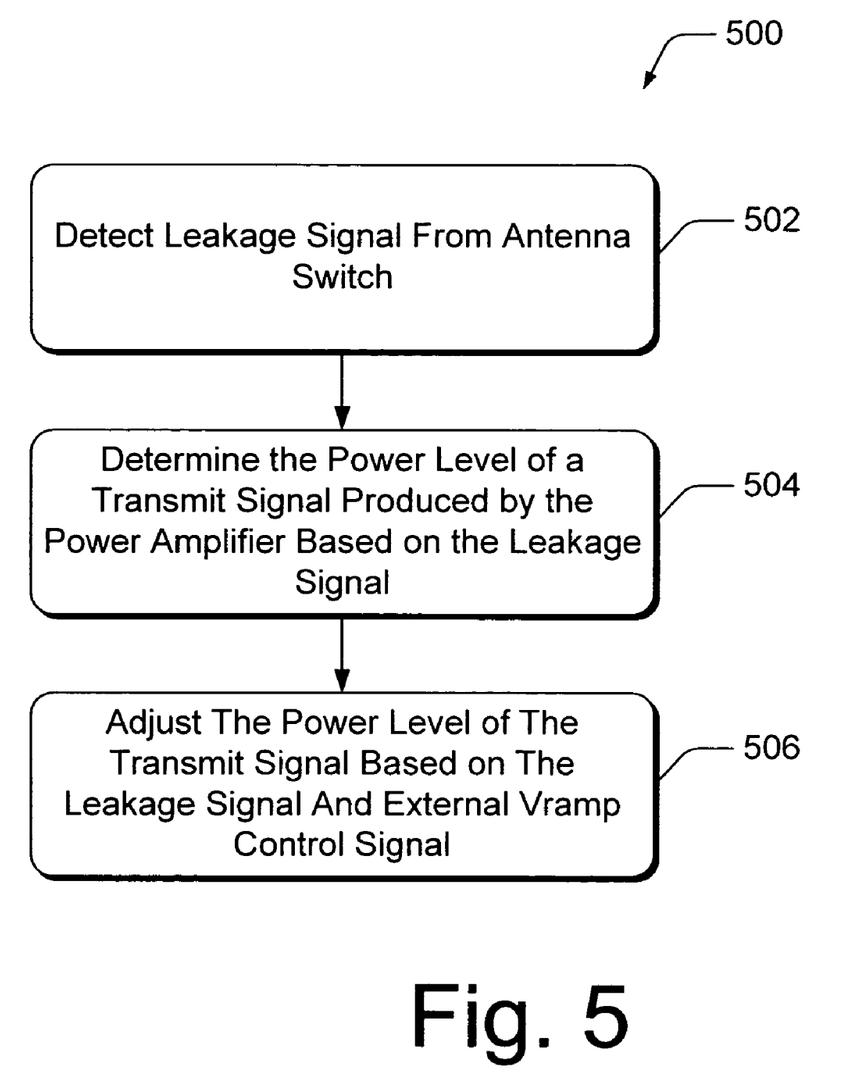
FIG. 5 illustrates a method used to determine the power level of a transmit signal produced by a RF power amplifier.

FIG. 5 illustrates a method 500 used to determine the power level of a transmit signal produced by a RF power amplifier. Method 500 includes blocks 502, 506, and 508. The order in which the method is described is not intended to be construed as a limitation, and any number of the described method blocks can be combined and/or performed simultaneously. Furthermore, the method can be implemented in any suitable hardware, software, firmware, or combination thereof.

In block 502 a leakage signal is detected from an antenna switch. For example, in one implementation the power amplifier detector 112 (FIGS. 1, 2, and 3) detects the leakage signal (FIGS. 1, 2, and 3) from the control line 204 (FIGS. 2 and 3) at node B which is located between the switch driver 202 (FIGS. 2 and 3) and the antenna switch 110 (FIGS. 1, 2, and 3). Alternatively, the power amplifier detector 112 (FIGS. 1 and 4) detects the leakage signal from one of the receive ports 404 (FIGS. 4A and 4B) of the antenna switch 110 (FIGS. 1, 4A, and 4B).

In block 504 the power level of the transmit signal is determined based on the leakage signal detected from the antenna switch described in block 502. Since the leakage signal is indicative of a portion of the power level of the transmit signal produced by the RF power amplifier, it is possible to determine the power for the transmit signal based on a power level for the leakage signal. For example, the power amplifier detector 112 (FIGS. 1, 2, 3, 4A and 4B) determines the power level for the transmit signal (FIGS. 1, 2, 3, 4A and 4B).

In block 506, the output power level of the power amplifier can be adjusted based on the detected leakage signal and an external control signal $V_{RAMP}$. For example, a power amplifier controller 114 (FIGS. 1, 2, 3, and 4) sends the power amplifier control signal (FIGS. 1, 2, 3, 4A and 4B) to the power amplifier 108 (FIGS. 1, 2, 3, 4A and 4B) to adjust the power level of the transmit signal (FIGS. 1, 2, 3, 4A and 4B.

Although the invention has been described in language specific to structural features and/or methodological acts, it is to be understood that the invention defined in the appended claims is not necessarily limited to the specific features or acts described. Rather, the specific features and acts are disclosed as exemplary forms of implementing the claimed invention.

What is claimed is:

1. An apparatus for transmitting and receiving wireless signals, the apparatus comprising:
   an RF transmit path including a power amplifier configured to produce an amplified transmit signal at a power level;
   an RF receive path;
   an antenna switch operably connected to said RF transmit path, said RF receiver path, an antenna, and a switch driver, the antenna switch configured to switch the antenna between the RF receive path and the RF transmit path based on a control signal from said switch driver;

a control line connected between said antenna switch and a switch driver;

a power amplifier detector connected to said control line, the power amplifier detector configured to receive a leakage signal leaking from the antenna switch through said transmit control line, and measure a power level of the leakage signal, which is indicative of the power level of the amplified transmit signal when the antenna switch is connected to the RF transmit path; and a power amplifier controller connected to the power amplifier detector and the power amplifier, the power amplifier controller configured to adjust the power level of the power amplifier based on the leakage signal detected by the power amplifier detector.

2. The apparatus as recited in claim 1, wherein the apparatus is a wireless device.

3. The apparatus of claim 1, wherein said antenna switch is configured to receive a DC control signal from said switch driver to connect either said RF transmit path or said RF receive path to said antenna.

4. The apparatus of claim 3, wherein said control line comprises a capacitor, said switch driver being connected between said capacitor and said antenna switch and said detector is connected on the other side of said capacitor.

5. The apparatus of claim 4, wherein said control line comprises a capacitor and a resistor, wherein said power amplifier detector is connected between said capacitor and said resistor and said switch driver is connector between said capacitor and said antenna switch.

6. The apparatus of claim 4, wherein said capacitor is configured to block control signals from said power amplifier driver from reaching said detector but conducts said leakage signal.

7. An apparatus, comprising:

an RF transmit path including a power amplifier, configured to amplify a transmit signal to a particular power level;

an RF receive path;

an antenna switch operably connected to said transmit path, said receiver path, an antenna, and a switch driver, the antenna switch configured to switch the antenna between the RF receive path and the RF transmit path;

said switch driver connected to the antenna switch via a control line;

a power amplifier detector connected to the control line, the power amplifier detector configured to receive a leakage signal from the antenna switch when it is connected to the RF transmit path to detect the particular power level of the transmit signal, wherein said leakage signal is indicative of the power level of the transmit signal detected on the control line; and a power amplifier controller connected to the power amplifier detector and the power amplifier, the power amplifier controller configured to adjust the power level of transmit signal produced by the power amplifier based on the leakage signal detected by the power amplifier detector.

8. The apparatus as recited in claim 7, wherein the apparatus is a wireless device.

9. The apparatus as recited in claim 7, wherein the apparatus is a transmit module of a wireless device.

10. The apparatus of claim 7, wherein said antenna switch is configured to receive a DC control signal from said switch driver to connect either said RF transmit path or said RF receive path to said antenna.

11. The apparatus of claim 10, wherein said control line comprises a capacitor, said switch driver being connected between said capacitor and said antenna switch and said detector is connected on the other side of said capacitor.

12. The apparatus of claim 11, wherein said control line comprises a capacitor and a resistor, wherein said power amplifier detector is connected between said capacitor and said resistor and said switch driver is connector between said capacitor and said antenna switch.

13. The apparatus of claim 11, wherein said capacitor is configured to block control signals from said power amplifier driver from reaching said detector but conducts said leakage signal.

14. A method, comprising:

detecting a leakage signal from a control line connector to an antenna switch operably connected to an RF transmit path, an RF receive path and an antenna, wherein the leakage signal is indicative of a portion of an power level of a transmit signal produced by a radio frequency (RF) power amplifier on the transmit path when said antenna is connected to said RF transmit path; and measuring a power level of said leakage signal at a power amplifier detector wherein the power amplifier detector is not on said RF receive path; and at a power amplifier controller connected to said power amplifier detector and the power amplifier, adjusting the output power level of the power amplifier based on the detected leakage signal.

15. The method as recited in claim 14, wherein said power amplifier detector is connected to a port on the antenna switch.

16. The method as recited in claim 14, wherein said power amplifier detector is connected to a control line between a driver for the antenna switch and the antenna switch.

17. The method of claim 14, wherein said antenna switch receives a DC control signal from said switch driver to connect either said RF transmit path or said RF receive path to said antenna.

18. The method of claim 17, wherein said control line comprises a capacitor, said switch driver being connected between said capacitor and said antenna switch and said detector is connected on the other side of said capacitor such that said leakage signal is coupled across said capacitor before being detected.

19. The method of claim 18, wherein said control line comprises a capacitor and a resistor, wherein said power amplifier detector is connected between said capacitor and said resistor and said switch driver is connector between said capacitor and said antenna switch.

20. The method of claim 18, wherein said capacitor is configured to block control signals from said power amplifier driver from reaching said detector but conducts said leakage signal.

* * * * *